(12) United States Patent
Calabrese et al.

(10) Patent No.: US 10,439,608 B2
(45) Date of Patent: Oct. 8, 2019

(54) CURRENT LIMITING I/O INTERFACE AND ISOLATED LOAD SWITCH DRIVER IC

(71) Applicant: Texas Instruments Incorporated, Dallas, TX (US)

(72) Inventors: Giacomo Calabrese, Freising (DE); Maurizio Granato, Milan (IT); Giovanni Frattini, Travacò Siccomario (IT)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/161,128

(22) Filed: Oct. 16, 2018

(65) Prior Publication Data

US 2019/0052263 A1    Feb. 14, 2019

Related U.S. Application Data

(62) Division of application No. 15/492,256, filed on Apr. 20, 2017, now Pat. No. 10,135,439.

(51) Int. Cl.
| | | |
|---|---|---|
| *H03K 19/00* | (2006.01) | |
| *H03K 17/691* | (2006.01) | |
| *H03K 5/08* | (2006.01) | |

(52) U.S. Cl.
CPC ............ *H03K 17/691* (2013.01); *H03K 5/08* (2013.01); *H03K 19/0005* (2013.01)

(58) Field of Classification Search
CPC ..... H03K 17/691; H03K 19/0005; H03K 5/08
See application file for complete search history.

(56) References Cited

U.S. PATENT DOCUMENTS

| | | | |
|---|---|---|---|
| 5,689,407 A | * | 11/1997 | Marinus ............ H02M 3/33523 363/21.15 |
| 5,859,768 A | | 1/1999 | Hall et al. |
| 8,749,995 B2 | | 6/2014 | Frattini et al. |
| 2002/0066904 A1 | | 6/2002 | Yuan et al. |

OTHER PUBLICATIONS

"PCA9536 Remote 4-Bit I2C and SMBus I/O Expander with Configuration Registers," Texas Instruments, SCPS125G Apr. 2006, Revised Jun. 2014 (29 pages).

* cited by examiner

*Primary Examiner* — Jung Kim
(74) *Attorney, Agent, or Firm* — John R. Pessetto; Charles A. Brill; Frank D. Cimino

(57) ABSTRACT

Disclosed examples include isolated load switch driver circuits to drive a load, including an impedance circuit that receives a digital input voltage signal from a signal source, and selectively allows a current signal to flow from the signal source to charge a buffer capacitor. An impedance control circuit controls the impedance circuit to limit the current signal in response to the buffer capacitor reaching a first threshold voltage, and an output circuit provides an output isolated from the digital input voltage signal to switch the load. A signaling circuit selectively enables the output circuit to draw power from the buffer capacitor in response to the voltage of the buffer capacitor reaching the first threshold voltage.

7 Claims, 7 Drawing Sheets

CURRENT LIMITING I/O INTERFACE AND ISOLATED LOAD SWITCH DRIVER IC

CROSS-REFERENCE TO RELATED APPLICATION(S)

This divisional application claims priority to U.S. patent application Ser. No. 15/492,256, filed Apr. 20, 2017, which application is incorporated herein by reference in its entirety.

BACKGROUND

Microcontrollers, logic devices and other low voltage circuits often include digital outputs to control external devices. Load drivers are used to interface a low voltage digital output to switch high voltage loads, such as turning lights on or off. Opto-couplers are often used for load switch drivers to optically transfer a switch signal across an isolation barrier. Relays can also be used to drive an isolated load. However, the current needed to energize the relay coil is often more than can be supplied by most digital outputs and a transistor or a relay driver is required to interface the relay coil with the digital output. Moreover, relays include moving parts that can degrade over time, and relays generate electromagnetic interference (EMI). Solid state relays or SSRs do not have any moving components. SSRs often use optical isolation to energize an internal LED to illuminate and switch on a photo-sensitive diode (photo-voltaic or PV diode). The PV diode current turns on a back-to-back thyristor, SCR, TRIAC or MOSFET to switch the isolated load, and the optical coupling isolates the low voltage control circuit from the load. Opto-couplers and solid state relays can be packaged in a four-pin integrated circuit package, with two input pins and two output pins. However, non-optical solutions typically require separate power connections in addition to the input and output pins. In addition, separate power must be supplied to operate these non-optical load switch drivers.

SUMMARY

Disclosed examples include isolated load switch driver circuits and switch driver ICs to drive a load, including an impedance circuit that receives a digital input voltage signal from a signal source, and selectively allows a current signal to flow from the signal source to charge a buffer capacitor. An impedance control circuit controls the impedance circuit to limit the current signal in response to the buffer capacitor reaching a first threshold voltage, and an output circuit provides an output isolated from the digital input voltage signal to switch the load. A signaling circuit selectively enables the output circuit to draw power from the buffer capacitor in response to the voltage of the buffer capacitor reaching the first threshold voltage.

DETAILED DESCRIPTION

Figure 1:
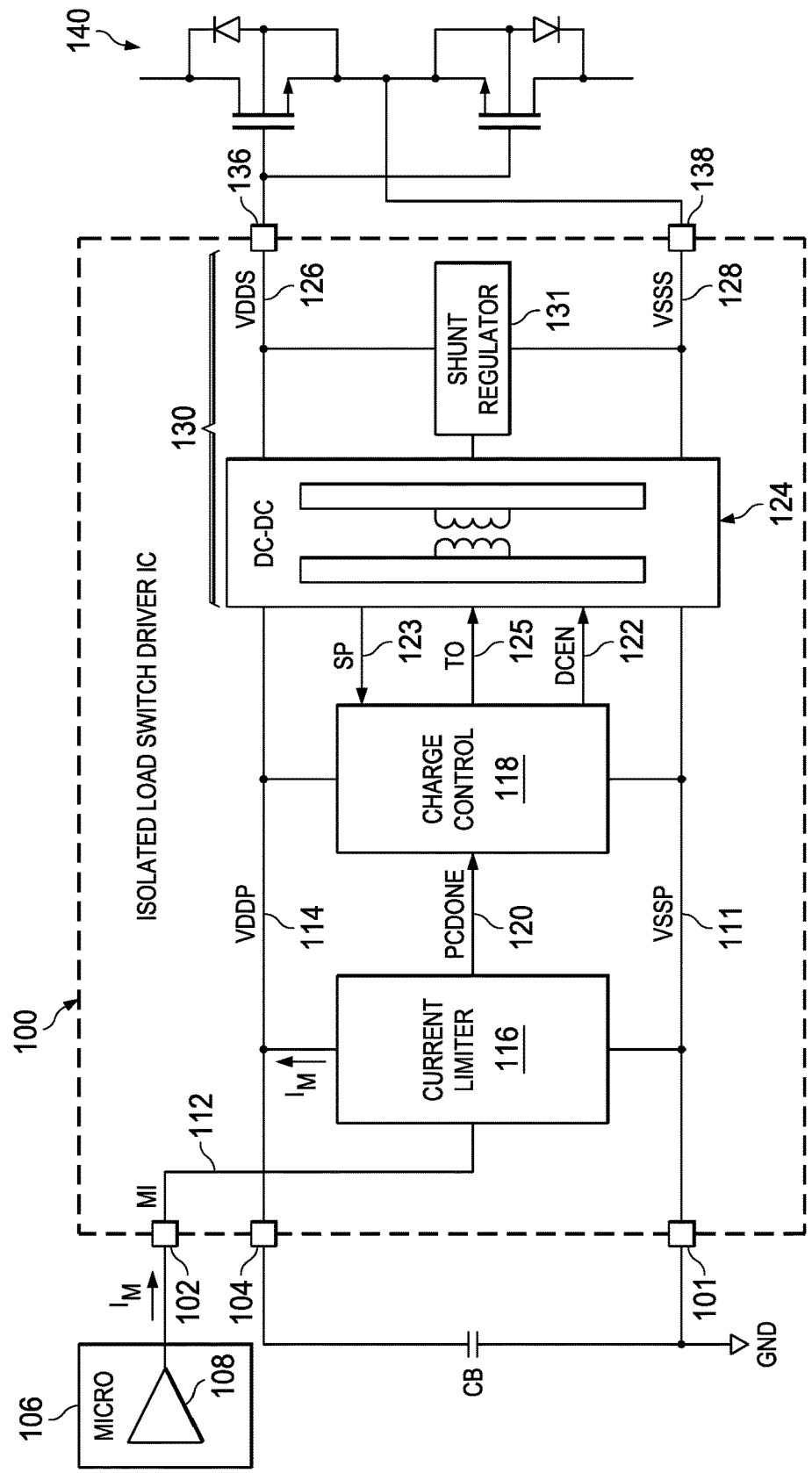
FIG. 1 is a schematic diagram of an isolated load switch driver integrated circuit (IC) with a current limiter, a charge control circuit and an output circuit with a DC-DC converter according to one embodiment.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the terms "couple", "coupled" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows an isolated load switch driver integrated circuit or IC 100 configured to drive a load according to a digital input signal MI (micro in) from a low voltage microprocessor or microcontroller circuit 106. The IC 100 includes a current limiter circuit 116 and a charge control circuit 118, as well as an output circuit 130 to provide an output signal VDDS to operate an output switch circuit 140 or other load according to the digital input signal MI. The IC 100 includes a first input pin 101 connected to a reference voltage (GND) to establish a reference voltage VS SP at an internal node 111. In addition, the IC 100 includes a second input pin 102 to receive the digital input voltage signal MI. The digital input voltage signal MI has two distinct states, including a first state in which the input voltage is a first voltage (e.g., HIGH relative to the reference voltage VSSP), and a different second state in which the input voltage is a second voltage (e.g., LOW or zero relative to VSSP). The current limiter circuit 116 operates to selectively charge a buffer capacitor CB by allowing a current signal $I_M$ (e.g., microprocessor output current) to flow from the microprocessor or other signal source 106 to the buffer capacitor CB. In certain examples, the current limiter circuit 116 provides a controlled impedance between the buffer capacitor CB and a signal input node 112 connected to the second input pin 102. In the example of FIG. 1, an external buffer capacitor CB is connected between the reference voltage of the first IC pin 101 and an output 114 of the current limiter circuit 116 connected to an additional IC pin 104. In this example, the buffer capacitor has a first terminal connected to the first pin 101 and a second terminal CB connected to the IC pin 104. In certain examples, the buffer capacitor CB is integrated in the IC 100 (e.g., FIGS. 6 and 7 below). Charging of the capacitor CB establishes a primary-side DC supply voltage VDDP at the circuit node 114 relative to the reference voltage VSSP at the circuit node 111. The voltage VDDP, in turn, is connected to a DC-DC converter 124 of the output circuit 130. In this manner, the IC 100 does not need external supply connections.

The output circuit 130 includes first and second output circuit nodes 126 and 128 on a secondary-side of the isolated DC-DC converter 124. The nodes 126 and 128 are respectively connected to pins 136 and 138 of the IC 100 to allow electrical connection to a driven load 140. In one example, the driver IC 100 is used to provide a drive or control signal to a back-to-back pair of N-channel or NMOS transistors 140 to implement high-voltage load switching. Other types and forms of output load can be driven by the isolated load switch driver IC 100. The microprocessor 106 in the illustrated example includes an output driver 108, such as an op amp or a CMOS output circuit. In this example, the microprocessor 106 sets the voltage of the digital input voltage signal MI to a desired state for driving the load 140, and the output circuit 130 provides the driver output signal at the output pin 136 as an output voltage VDDS relative to an output reference voltage VSSS at the pin 138 when the digital input signal MI is asserted. The output circuit 130 in this example also includes a shunt regulator circuit 131, and other output circuit components can be included, such as output capacitors, filters, gate drivers, etc. (not shown). The DC-DC converter 124 provides a galvanic isolation barrier between the primary side input voltage VDDP and the secondary side output voltage VDDS. In one possible implementation, the DC-DC converter 124 includes a transformer with primary and secondary windings, as well as one or more switching circuits and/or rectifiers (not shown) to switch the voltage applied to the primary winding and to rectify a current signal received at the secondary winding in order to provide DC-DC conversion with galvanic isolation. The circuits 116, 118 and 130 thus provide an isolated load switch driver that allows the microprocessor 106 or other signal source to present a digital input signal MI that causes galvanically isolated establishment of the output signal VDDS to switch a load between first and second states in accordance with the input signal MI.

In operation, the current limiter circuit 116 selectively allows the current signal $I_M$ to flow from the signal source 106 to charge a buffer capacitor CB. The current limiter circuit 116 in certain examples provides an impedance control circuit to control the impedance between the circuit nodes 112 and 114 to initially provide low impedance fast charging of the buffer capacitor CB in a first mode (e.g., PRECHARGE mode) in response to the digital input voltage signal MI transitioning from the reference voltage VSSP to a second voltage. In one example, the current limiter circuit 116 connects the nodes 112 and 114 to one another using a low impedance back-to-back transistor circuit in the first mode without actively limiting the charging current signal $I_M$. In response to the buffer capacitor voltage VDDP reaching a first threshold voltage VTH1 (e.g., FIG. 5 below), the current limiter circuit 116 operates in a second mode (e.g., CURRENT LIMIT mode) to provide a controlled non-zero impedance between the second input pin 102 and the upper terminal of the buffer capacitor CB to limit the amplitude of the current signal $I_M$. In addition, the current limiter circuit 116 includes an output 120 which provides a precharge completion or done signal PCDONE to the charge control circuit 118 to indicate that the buffer capacitor voltage VDDP has reached the first threshold voltage VTH1.

The charge control circuit 118 includes a signal output 122 to provide an enable signal DCEN to enable the DC-DC converter circuit 124 in response to the signal PCDONE. The DCEN signal enables the output circuit 130 to draw power from the buffer capacitor CB and to selectively provide the voltage output signal VDDS to the third and fourth IC pins 136 and 138. In the illustrated example, the DC-DC converter circuit 124 includes a signal output 123 to provide a power request or "send power" signal SP to the charge control circuit 118. The charge control circuit 118 includes a second output 125 to provide a "turn off" signal TO to the DC-DC converter circuit 124 for controlled shut down.

As seen in FIG. 1, the isolated load switch driver IC 100 does not require external supply power in order to drive a load 140 based on the received digital input voltage signal MI from the microprocessor 106. In addition, the IC 100 provides galvanically isolated switching control without requiring optical circuitry. Moreover, the switch driver IC 100 can be used in a variety of switching applications, including switching high-voltage loads 140 without moving parts. Accordingly, the IC 100 can be used in a variety of isolated load switching applications without the shortcomings associated with optocouplers, relays/relay driver circuits and solid-state relays. Also, the disclosed isolated load switch driver circuits 100 operate using power derived from the digital input voltage signal MI. Specific implementations provide use of a single IC pin 102 as both a power supply input and a signal input. This reduces trace routing complexity of a host circuit board (PCB, not shown) and can potentially reduce the pin count for different implementations of the IC 100. Further pin count reductions are possible, for example, by incorporating the buffer capacitor CB in the IC 100 (e.g., FIGS. 6 and 7 below) and/or by incorporating an output driver transistor in the IC 100 (e.g., FIG. 7 below).

In certain examples, the IC can be implemented as a 4-pin chip with an identical pin-out as commercially available opto-couplers or relays. For example, the opto-coupler photodiode pins can be replaced by the first and second pins 101 and 102 of the disclosed IC, and the opto-coupler output pins can be replaced with the output pins 136 and 138 of the IC 100 (e.g., pins 701 and 702 in FIG. 7 below). Pin-out equivalents can be constructed for replacing relays or SSRs, replacing the relay coil pins with the input pins 101 and 102, and replacing the relay contact pins with the output pins 136 and 138 (701 and 702 in FIG. 7). Such implementations facilitate substitutions for opto-couplers or opto MOS circuits or relay driver circuits for existing PCB designs to communicate with two-pin output devices to switch a load 140. In certain examples (e.g., FIGS. 6 and 7), a 4-pin isolated load switch driver IC 100 is possible, including two input pins and two output pins. The IC 100 provides a non-optical isolated driver solution that obtains DC-DC power from the signal source 106 via the signal input pin 102.

The disclosed IC 100, moreover, includes the current limiter 116, which can be implemented to limit the current draw from the signal source 106 to be at least as good or better (lower current consumption) than the signal input (e.g., photodiode) of an opto-coupler (e.g., milliamps). In one non-limiting example, the current limiter circuit 116 implements current limiting in a second operating mode to limit the current to half a milliamp (500 µA) current consumption on the primary side in the second mode (e.g., $I_M \leq 500$ µA). Other current limit levels can be used in different embodiments, and disclosed examples advantageously implement any suitable current limit amplitudes for compatibility with standard digital I/O drive strengths. In addition, the illustrated examples do not require extra power input connections, and the example IC 100 operates when the digital input voltage signal MI is asserted (e.g., active high), and consumes no power when the digital input voltage signal is low. Once sufficiently charged, the buffer capacitor CB provides charge to supply the isolated output circuit 130 under control of the output control circuit 118 in response to the enable signal DCEN.

Figure 2:
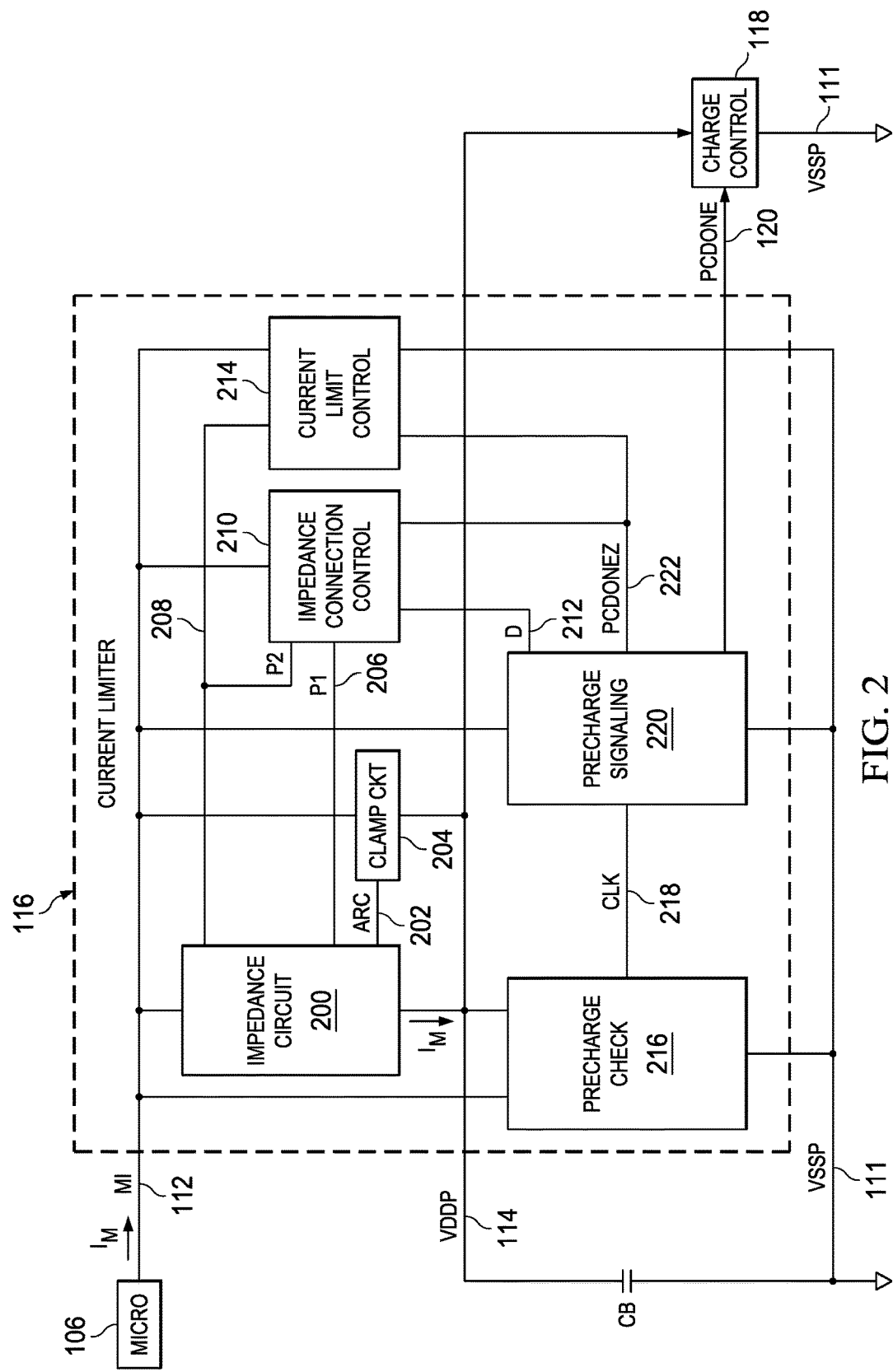
FIG. 2 is a schematic diagram of an example current limiter circuit in an embodiment of the switch driver IC of FIG. 1.
Figure 3:
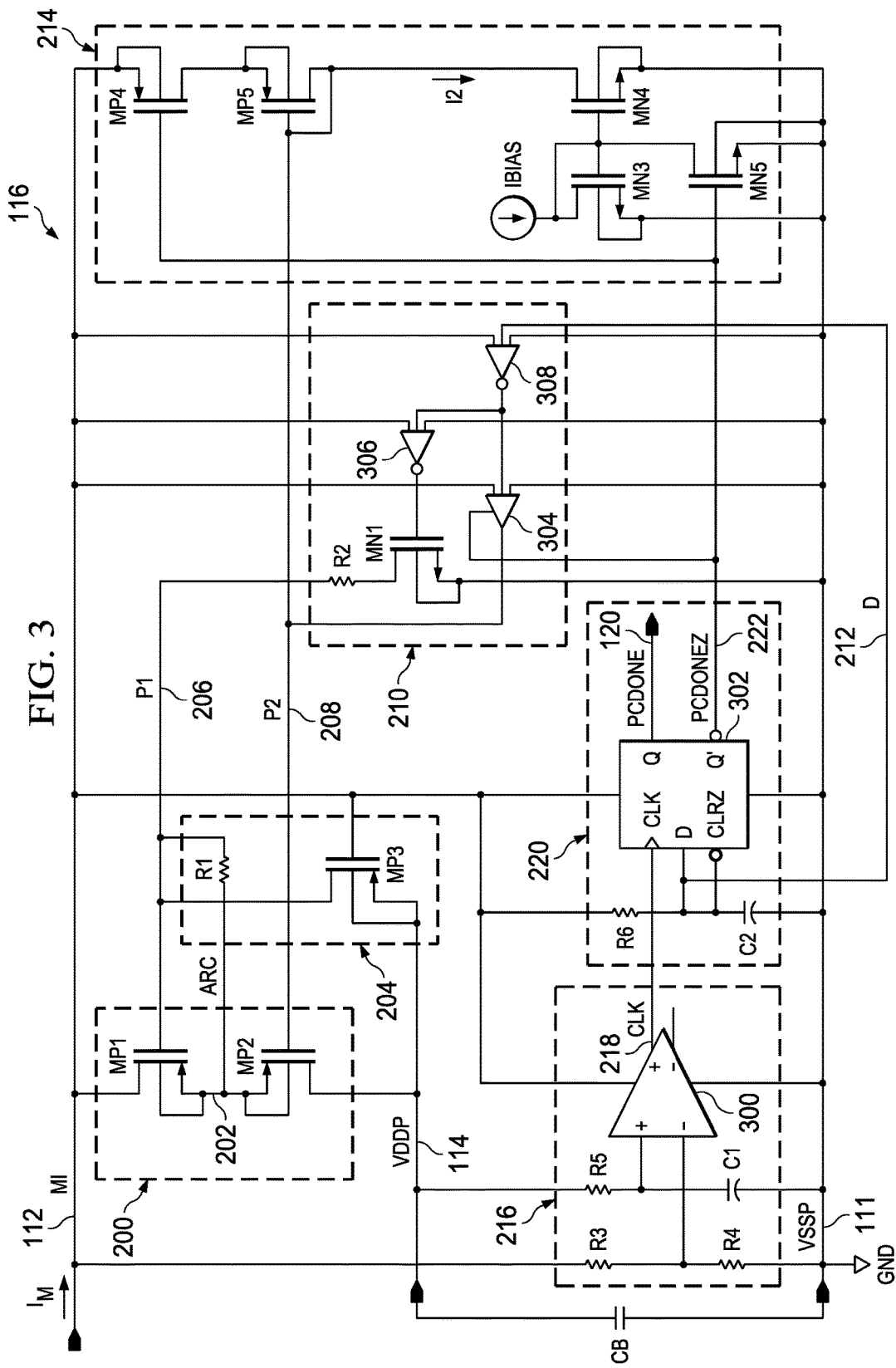
FIG. 3 is a schematic diagram showing further details of the current limiter circuit embodiment of FIG. 2.

Referring also to FIGS. 2 and 3, FIG. 2 shows an example current limiter circuit 116 and FIG. 3 illustrates further details of the current limiter circuit embodiment 116 of FIG. 2. The example current limiter circuit 116 includes an impedance circuit 200 connected between the circuit nodes 112 and 114 to provide a controlled impedance between the signal input node 112 and the buffer capacitor CB. The impedance circuit 200 includes an input 202 that receives a clamping signal ARC from a clamp circuit 204 used for controlled shutdown. The impedance circuit 200 is controlled in the first and second modes according to first and second signals P1 and P2 provided by an impedance connection control circuit 210 and a current limit control circuit 214. As best seen in FIG. 3, the impedance circuit 200 includes a PMOS or P-channel first transistor MP1 connected between the second input pin 102 and a first circuit node 202, as well as a PMOS or P-channel second transistor MP2 connected between the first node 202 and the second terminal of the buffer capacitor CB at the node 114. This back-to-back configuration facilitates impedance control as described further below. The clamp circuit 204 is connected to the impedance circuit, and includes a PMOS or P-channel third transistor MP3 connected between the gate control terminal of the transistor MP1 and the second terminal of the buffer capacitor CB at the node 114. The clamp circuit 204 also includes a resistor R1 connected between the control terminal (e.g., gate) of MP1 and the first node 202. The third transistor MP3 includes a control terminal (e.g., gate) connected to the second input pin 102 at the node 112.

The impedance connection control circuit 210 switches the impedance circuit 200 from the first mode PRECHARGE to the second mode CURRENT LIMIT in response to the signal PCDONE indicating that the buffer capacitor CB is sufficiently precharged to the first threshold voltage VTH1. The impedance connection control circuit 210 in FIG. 3 includes a first output 206 which provides the first signal P1 to the gate of MP1 to turn MP1 on in the first mode PRECHARGE. The impedance connection control circuit 210 includes a second output 208 which provides the second signal P2 to a control terminal of the second transistor MP2 to turn the second transistor MP2 on in the first mode PRECHARGE. After precharging, the impedance connection control circuit 210 removes the second signal P2 in the second mode CURRENT LIMIT. The current limiter circuit 116 in FIGS. 2 and 3 also includes a current limit control circuit 214 that provides a third signal on the node 208 (signal P2) in the second mode CURRENT LIMIT to limit the amplitude of the current signal $I_M$.

In the illustrated example, the impedance connection control circuit 210 turns on MP1 and MP2 in the first mode to provide a direct (e.g., low impedance) connection between the digital input node 112 and the node 114 to quickly charge the buffer capacitor CB. Once the buffer capacitor CB is sufficiently charged to the first threshold voltage VTH1, the control circuit 210 removes its signal at the output 208 and the current limit control circuit 214 thereafter provides the current limiting control over the second impedance circuit transistor MP2. This operation advantageously facilitates interfacing with microprocessor digital output driver circuits (e.g., 108 in FIG. 1) and other low-voltage signal sources. The initial low impedance operation in the first mode allows currents that can be sourced by conventional digital output driver circuitry, and the subsequent operation in the current limiting second mode mitigates or prevents overloading the output drive capability of the signal source 106, 108.

The current limiter circuit 116 also provides precharge or signaling circuitry, including a precharge check circuit 216 and a precharge signaling circuit 220. The precharge check circuit 216 monitors the voltage VDDP across the buffer capacitor CB via a connection to the node 114, and includes a comparator 300 (FIG. 3) that compares the VDDP signal with the digital input voltage signal MI via a connection to the node 112. In the example of FIG. 3, a resistor R3 connects the input node 112 to an inverting input of the comparator 300, and the inverting input is connected through a resistor R4 to the reference voltage node 111. R3 and R4 form a voltage divider circuit to provide a signal to the inverting input of the comparator 300. A non-inverting input of the comparator 300 is connected through a resistor R5 to the supply voltage node 114, and is also connected through a capacitor C1 to the reference voltage node 111. The comparator 300 includes an output 218 that provides a clock signal CLK to a flip-flop 302 of the precharge signaling circuit 220 in response to the buffer capacitor voltage VDDP at the node 114 rising to the threshold voltage level VTH1.

The precharge signaling circuit 220 has an output 120 that provides the precharge completion signal PCDONE to the charge control circuit 118 (FIG. 1) in response to the buffer capacitor supply voltage VDDP reaching the first threshold voltage VTH1. In addition, the precharge signaling circuit 220 provides an inverse precharge completion signal PCDONEZ at an output 222. The PCDONEZ signal has inverted logic relative to the signal PCDONE. The output 222 provides the PCDONEZ signal to the impedance connection control circuit 210 and to the current limit control circuit 214. The flip-flop 302 includes a data input 212 that receives an input signal D from a node joining the resistor R6 and a second capacitor C2 connected between the node 112 and the reference voltage node 111.

When the flip-flop 302 of the precharge signaling circuit 220 receives the clock input signal CLK from the comparator 300, the PCDONEZ signal is asserted high at the output 222. This signal enables a current mirror circuit in the current limit control circuit 214, and also enables a tristate buffer 304 in the impedance connection control circuit 210. As shown in FIG. 3, the impedance connection control circuit 210 includes a resistor R2 connected between the first output 206 and the drain of a first NMOS transistor MN1. The source of MN1 is connected to the reference voltage node 111. The circuit 210 further includes a tristate buffer 304, and inverters 306 and 308. The D signal at the node 212 is provided to the input of the inverter 308, and the output of the inverter 308 provides an input signal to the inverter 306 and to the tristate buffer 304. The output of the tristate buffer 304 is connected to the second output node 208 to selectively provide the second signal P2 to the gate control terminal of the second impedance circuit transistor MP2 in the first (PRECHARGE) mode.

When the MI voltage is sufficiently high to cause the D signal to activate the input of the inverter 308 (high), the input to the inverter 306 and the tristate buffer 304 is low e.g., approximately at the voltage VSSP of the reference node 111. In this state, the output of the inverter 306 goes high to turn on the transistor MN1. This connects the lower terminal of the resistor R2 to the reference voltage node 111, and pulls the voltage signal P1 at the first output node 206 low to turn on the first impedance transistor MP1. In this state, when the PCDONEZ signal at the node 222 goes high, the tristate buffer 304 is enabled and drives the voltage signal P2 at the second output node 208 low. This turns on the second impedance circuit transistor MP2 in the first mode (PRECHARGE) before the buffer capacitor voltage VDDP reaches the first threshold voltage VTH1. In this manner, in the first mode (PRECHARGE) both impedance circuit transistors MP1 and MP2 are fully on, and a low impedance connection is provided between the digital input signal node 112 and the upper terminal of the buffer capacitor CB. This operation provides quick charging of the buffer capacitor CB in response to the signal source 106 (FIG. 1) asserting the digital input voltage signal MI in a high state.

The current limit control circuit 214 in FIG. 3 operates as a second control circuit, and includes a current mirror circuit formed by transistors MP4, MP5, MN3, MN4 and MN5. The current mirror circuitry is disabled in the first mode PRECHARGE when the PCDONEZ signal at the node 222 is high. A bias current IBIAS is provided to the drain and gate of an NMOS transistor MN3 and to the gate control terminal of the transistor MN4. An NMOS shutoff transistor MN5 is connected between the gates of MN3 and MN4 and the reference voltage node 111. The gate control terminal of MN5 is connected to the node 222. In the first mode, the signal PCDONEZ at the node 222 is high, which turns on MN5. This connects the gates of MN3 and MN4 to the reference voltage node 111, which disables the current mirror circuit of the current limit control circuit 214. When the supply voltage VDDP across the buffer capacitor CB rises to the first threshold voltage VTH1, PCDONE goes high and the signal PCDONEZ goes low to turn off MN5. This enables the current mirrors of the current limit control circuit 214 in the second mode (CURRENT LIMIT). In this mode, the bias current through MN3 is mirrored to the NMOS transistor MN4 to cause a corresponding current I2 to flow through MP4, MP5 and MN4. The ratio of the current I2 to the bias current IBIAS corresponds to the size ratio between MN3 and MN4. In one example, the bias current IBIAS is 2 µA and the mirrored current I2 is 2 µA. The transistors MP2 and MP5 are sized with a ratio of 250, so the steady-state current limit for $I_M$ is 500 µA. The PMOS transistor MP5 establishes a drain and gate voltage according to the amplitude of the mirrored current I2, and the gate/drain of MP5 is connected to the second output node 208. When enabled in the second mode, the current limit control circuit 214 thus provides a third signal (e.g., P2) to the gate of the second impedance circuit transistor MP2 to set the limited operating point of the impedance circuit 200 to limit $I_M$ to 500 µA.

In the illustrated example, the third signal voltage (P2) provided by the enabled current limit control circuit 214 to the node 208 is such that the second impedance transistor MP2 is not fully on during the second mode. The upper PMOS transistor MP4 is turned on when the PCDONEZ signal is high at the node 222 to disable the transistor MP5 from influencing the voltage at the node 208 (e.g., signal P2) in the first mode. In the second mode, when the signal PCDONEZ at the node 222 is pulled low, the transistor MP4 turns on to allow MP5 to control the voltage at the node 208 to limit the current $I_M$ through the impedance circuit 200. In this state, moreover, the PCDONEZ signal at the node 222 is low, and the tristate buffer 304 of the impedance connection control circuit 210 is tristate and or disabled. Thus, in the second mode (CURRENT LIMIT), the impedance connection control circuit 210 discontinues provision of the second output signal P2. In this manner, the circuit 214 regulates or limits the current $I_M$ flowing through the impedance circuit 200 in the second mode, while the tristate buffer 304 of the impedance connection control circuit 210 is disabled. As a result, once the pre-charging is completed, the current through the impedance circuit 200 is limited, and the microprocessor 106 or other digital input signal source is protected against excessive DC current draw.

Figure 4:
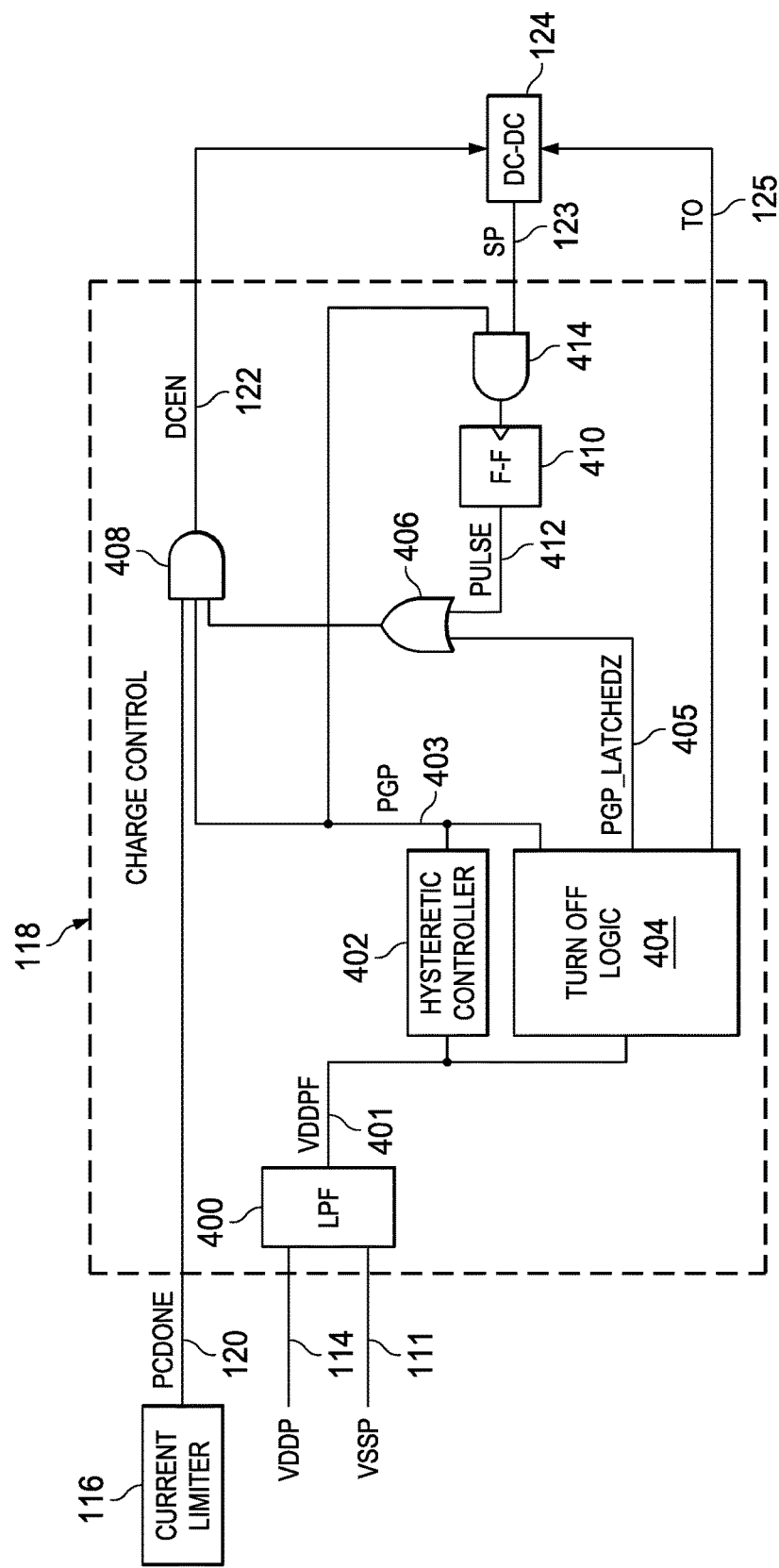
FIG. 4 is a schematic diagram of an example charge control circuit in an embodiment of the switch driver IC of FIG. 1.

Referring now to FIGS. 1 and 4, FIG. 4 illustrates an example charge control circuit 118 which can be used in the switch driver IC 100 of FIG. 1. In operation in the second mode, the charge control circuit 118 implements a dual threshold hysteretic voltage regulator to regulate the voltage VDDP of the buffer capacitor CB. The circuit 118 includes a low pass filter (LPF) 400 connected between the supply voltage node 114 and the reference voltage node 111 to filter the supply voltage VDDP and provide a filtered supply voltage signal VDDPF at a filter output node 401. The filtered supply voltage signal VDDPF is provided as an input to a hysteretic controller circuit 402 and a turnoff logic circuit 404. The controller 402 has an output 403 which provides a power good at primary signal PGP, such as a flip-flop output that is set or reset based on the amplitude of the filtered supply voltage signal VDDPF with some non-zero amount of hysteresis. The hysteresis provided by the hysteretic controller 402 implements second and third threshold voltage is VTH2 and VTH3 illustrated and described below in connection with FIG. 5. The PGP signal is provided as an input to the turn off logic circuit 404 and as an input to an AND gate 408. A second input of the AND gate 408 is connected to the node 120 to receive the PCDONE signal from the current limiter circuit 116. The turn off logic circuit 404 has an output 405, which provides a signal PGP_LATCHEDZ as an input to an OR gate 406. The output of the OR gate 406 is provided as a third input to the AND gate 408. The charge control circuit 118 also includes a flip-flop 410 with an output 412 that generates and provides a pulse signal PULSE as a second input to the OR gate 406. An AND gate 414 includes a first input connected to the output 403 of the hysteretic controller 402, and a second input connected to the output 123 of the DC-DC converter 124 (FIG. 1) to receive the send power (SP) signal. A clock input of the flip-flop 410 receives an output signal from the AND gate 414 when both the PGP and SP signals are active high. The turn off logic circuit 404 also provides a turnoff (TO) signal at the output 125 to cause the DC-DC converter 124 to turn off when the system is being shut down. The logic implemented by the gates 406, 408 and 414 and the flip-flop 410 allow the DC-DC converter to request that power be sent, but the send power request signal SP does not pass to the logic gates while the DC-DC converter is enabled.

The AND gate 408 of the charge control circuit 118 in FIG. 4 receives the output of the OR gate 406 at the third input, and an output 122 of the AND gate 408 provides the DC-DC enable signal DCEN to the DC-DC converter 124 of the output circuit 130 (FIG. 1). In this example, the signaling circuitry 216, 220 of the current limiter circuit 116 selectively enables the output circuit 130 to draw power from the buffer capacitor CB in response to the voltage VDDP the first threshold voltage VTH1 precharge completion signal PCDONE and PCDONEZ signal or signals. Thereafter in the second mode (CURRENT LIMIT), the charge control circuit 118 provides hysteretic voltage regulation with respect to the supply voltage across the buffer capacitor CB between threshold voltage levels VTH2 and VTH3.

Figure 5:
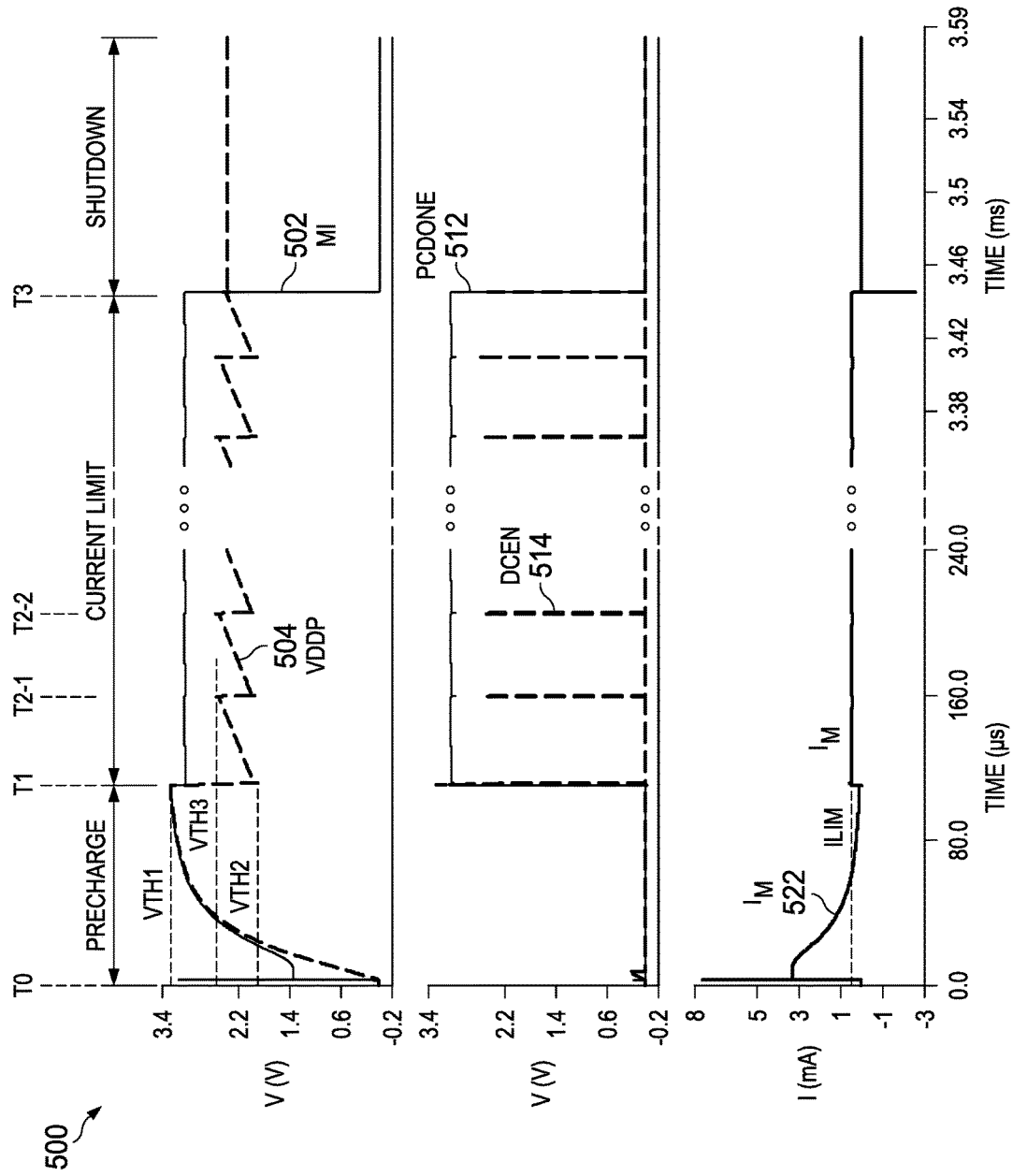
FIG. 5 is a signal diagram of voltage, current and control signals in an embodiment of the switch driver IC of FIG. 1.

Referring also to FIG. 5, a signal diagram 500 shows example voltage, current and control signals in an embodiment of the switch driver IC 100 of FIG. 1. The diagram 500 includes a curve 502 showing the digital input voltage signal MI and a curve 504 showing the supply voltage across the buffer capacitor CB (VDDP) over time, beginning with a precharge or first mode (PRECHARGE) from an initial time T0 through a time T1. Operation of the IC 100 begins when the digital input voltage signal MI transitions from a low voltage to a high voltage corresponding to the first threshold voltage VTH1. In the example of FIG. 5, the microprocessor 106 provides a high digital input voltage signal MI, and the signal rises as shown in the curve 502 to a supply voltage of the microprocessor 106, approximately 3.3 V in the illustrated example. From T0 through T1, the buffer capacitor CB is pre-charged, and the capacitor voltage curve 504 (VDDP) rises accordingly. During this first operating mode from T0 through T1, the impedance connection control circuit 210 of FIG. 2 turns the impedance circuit transistors MP1 and MP2 (FIG. 3) fully on to provide a low impedance connection to quickly charge the buffer capacitor CB. At T1, the supply voltage VDDP across the buffer capacitor CB reaches the first threshold voltage VTH1. This causes the impedance connection control circuit 210 to discontinue providing the P2 signal, and enables the current limit control circuit 214 to control the voltage on the node 208 to provide a controlled impedance between the signal input node 112 and the buffer capacitor CB. The second operating mode (CURRENT LIMIT) begins at T1 in FIG. 5, and continues until T3 when the microprocessor 106 changes the digital input voltage signal MI back to the low signal state. During this time between T1 and T3, the precharge signaling circuit 220 asserts the PCDONE signal at the output 120, shown as curve 512 in FIG. 5.

FIG. 5 also provides a current curve 522 illustrating the current signal $I_M$. As seen in FIG. 5, the current curve 522 initially rises to begin charging the buffer capacitor CB, and gradually declines as the capacitor voltage VDDP increases between T0 and T1. At time T1, the impedance circuit 200 is switched to the second mode (CURRENT LIMIT), and the DC-DC converter 124 of the output circuit 130 is enabled by the DCEN signal from the charge control circuit 118 in response to receiving the PCDONE signal from the current limiter circuit 116. Accordingly, the microprocessor current curve 522 is limited to a predetermined current limit ILIM established by the current limit control circuit 214 between T1 and T3 during the second operating mode. The charge control circuit 118 of FIG. 4 also enables the DC-DC converter circuit 124 of the output circuit 130 at time T1, and the AND gate 408 provides the DCEN signal at the output node 122 as a pulse signal shown as curve 514 in FIG. 5. The initial pulse 514 begins at time T1, which briefly enables the DC-DC converter 124 to draw power from the charged buffer capacitor CB. This pulse signal DCEN stays high until the capacitor supply voltage VDDP (curve 504) drops to a second threshold voltage level VTH2 lower than the first threshold VTH1 as shown in FIG. 5. In this manner, the charge control circuit 118 operates according to the signal PCDONE from the signaling circuit 216, 220 in FIG. 2 to provide the enable pulse signal DCEN in a first state (e.g., LOW) to disable the output circuit 130 in response to the voltage VDDP of the buffer capacitor CB transitioning down to VTH2. In addition, the charge control circuit 118 provides the enable pulse signal DCEN in a second state (e.g., high) to again enable the output circuit 130 to draw power from the buffer capacitor CB in response to the voltage VDDP of the buffer capacitor CB transitioning up to a third threshold voltage VTH3, where VTH3 is between the first and second threshold voltages VTH1 and VTH2.

As seen in FIG. 5, once the DC-DC converter circuit 124 is initially enabled at T1, the additional load draws current from the charged buffer capacitor CB, and the capacitor supply voltage VDDP drops to the second threshold voltage level VTH2. In response to this transition in the buffer capacitor voltage VDDP, the charge control circuit 118 discontinues the pulse signal DCEN (curve 514) shortly after time T1. As seen in the curve 504, the buffer capacitor voltage VDDP then begins to rise through recharging of the buffer capacitor CB until time T2-1 when the voltage VDDP reaches the third threshold voltage VTH3. At time T2-1, the charge control circuit 118 again asserts the DC-DC enable pulse signal DCEN high, which again transfers energy to the DC-DC converter 124 from the buffer capacitor, and the voltage VDDP again drops. Once the voltage VDDP again reaches the second threshold VTH2 shortly after time T2-1, the enable pulse (curve 514) ends, and the capacitor voltage (curve 504) begins rising again until a second example time T2-2. During this operation, therefore, the charge control circuit 118 operates to regulate the buffer capacitor supply voltage VDDP between the threshold values VTH2 (e.g., 1.9 V) and VTH3 (e.g., 2.5 V) at a level below the digital input voltage signal amplitude MI (e.g., 3.2-3.3 V). This example ensures that the buffer capacitor CB can be replenished through charging from the input pin 102 while the signal source current $I_M$ is limited to a reasonable level by operation of the current limit control circuit 214. Any suitable charge control circuit 118 can be used that selectively enables or disables the output circuit 130 with respect to drawing power from the charged buffer capacitor CB in response to the signaling related to the voltage VDDP of the buffer capacitor CB. In the example of FIG. 4, the logic of the charge control circuit 118 ensures that the send power request signal SP from the DC-DC converter circuit 124 is not passed to gate the enable signal DCEN while the DC-DC converter circuit 124 is enabled.

As further shown in FIG. 5, the above-described operation continues until the signal source microprocessor 106 changes the state of the digital input voltage signal MI to a low voltage (e.g., 0 V) at time T3. Thereafter, the IC 100 operates in a shut down mode (SHUTDOWN). When the voltage MI falls, the tristate buffer 304 and the inverter 306, as well as the current limit control circuit 214 in FIG. 3 are unpowered, and accordingly the transistors MP1 and MP2 of the impedance circuit 200 are turned off. The removal of the MI voltage from the node 112 also provides a 0 V gate voltage to the clamp circuit transistor MP3 whose source is connected to the charged buffer capacitor CB. This briefly allows current to flow from the capacitor CB through MP3 to the gate of the transistor MP1 through the resistor R1. At this point, the source voltage of MP2 at the node 202 is lower than VDDP, and the resistor R1 and MP3 increase this voltage until it reaches VDDP to turn MP1 off. This prevents discharge of the buffer capacitor CB through the input node 112 into the microprocessor signal source 106. Also, reducing the MI signal voltage to zero removes power from the flip flop 302 in the precharge signaling circuit 220, which causes PCDONE to go to 0 V. This prevents the charge control circuit 118 from enabling the DC-DC converter 124 of the output circuit 130. In addition, the voltage VDDP established across the buffer capacitor CB is used to shut down operation of the isolated load switch driver IC 100. As seen in FIG. 5, the current signal $I_M$ curve 522 initially goes negative and then stabilizes at zero once the impedance circuit 200 is turned off.

Figure 6:
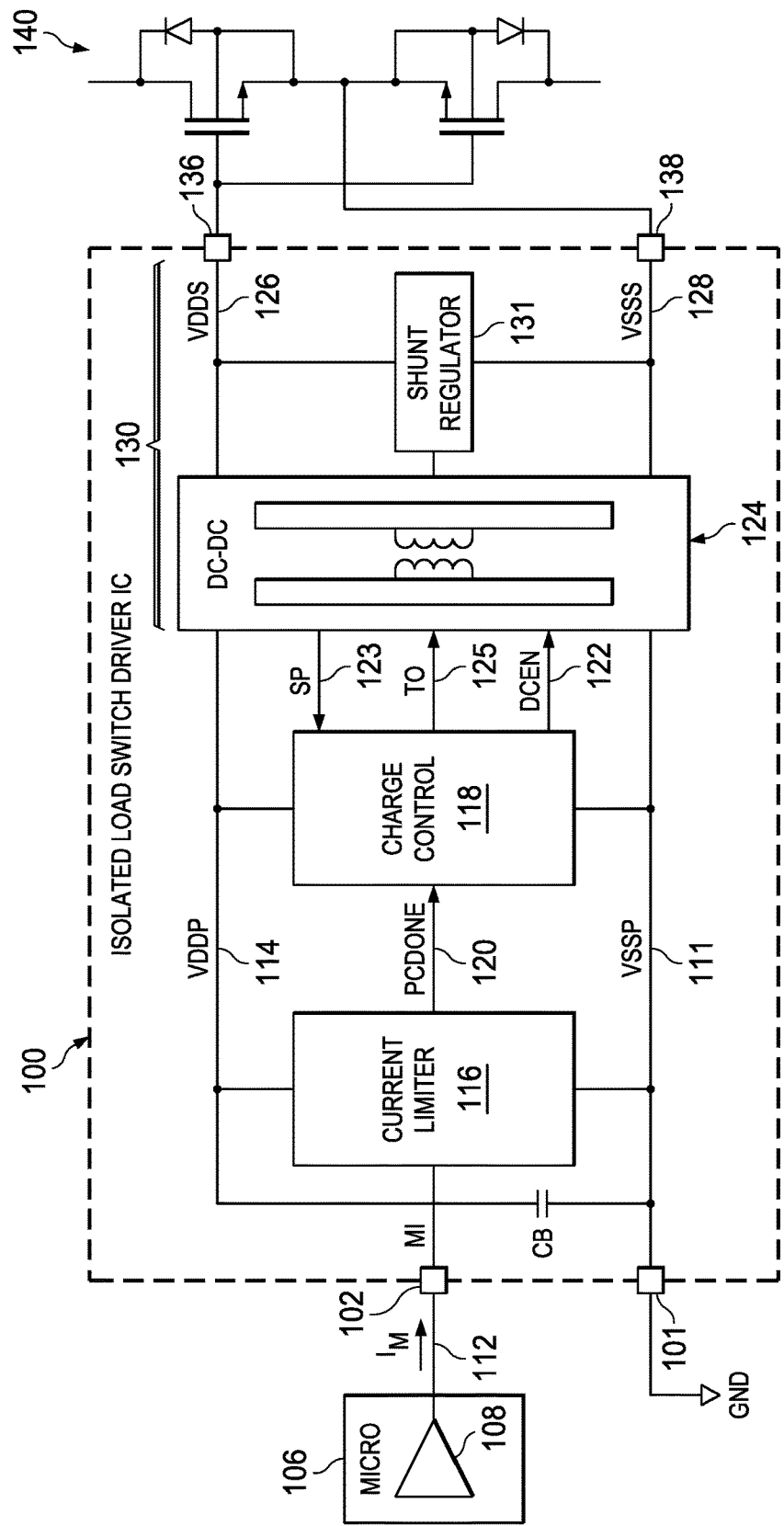
FIG. 6 is a schematic diagram of a switch driver IC with an integrated buffer capacitor according to another embodiment.
Figure 7:
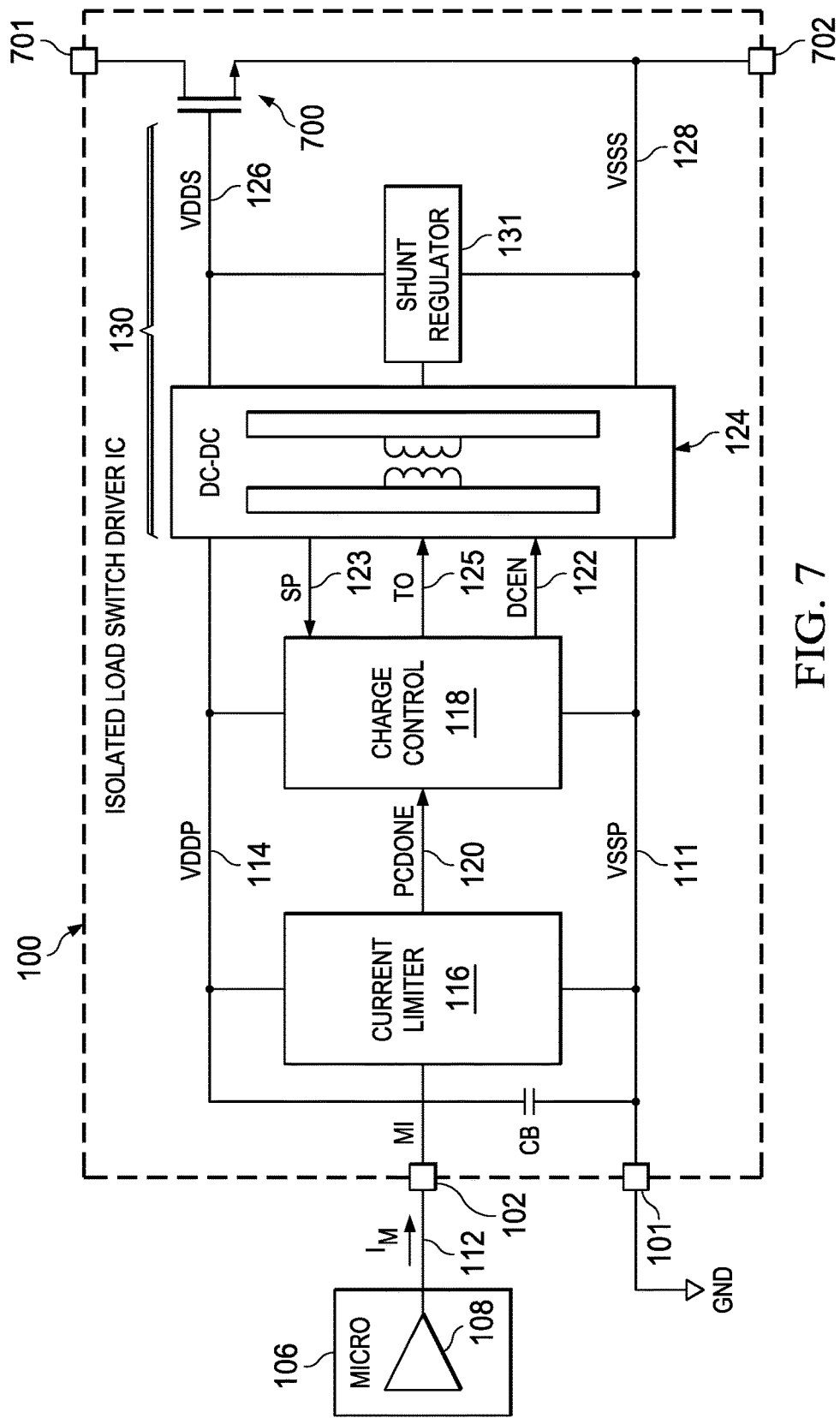
FIG. 7 is a schematic diagram of a switch driver IC with an integrated output transistor according to another embodiment.

Referring also to FIGS. 6 and 7, various other embodiments are possible. In FIG. 6, the buffer capacitor CB is integrated into the IC 100. This facilitates provision of a 4-pin IC 100, for example, to provide direct pinout correspondence to replace optocouplers and/or SSR drivers devices without changing circuit board layouts. FIG. 7 shows another example switch driver IC 100 as described above, with an integrated buffer capacitor CB and an integrated output transistor 700 according to another embodiment. In the illustrated example, the output transistor 700 is an N-channel MOS transistor with a drain connected to a first output pin or pad 701 and a source connected to a second output pin or pad 702. The gate of the output transistor 700 is connected to the VDDS signal provided by the DC-DC converter 124 in order to selectively turn the output transistor 700 on or off.

The disclosed examples and variants thereof provide impedance circuits, such as two back-to-back pass transistors (e.g., MP1 and MP2) operated either in current limit mode with a predetermined steady-state current limit or as a low impedance connection, in conjunction with a buffer capacitor CB. Certain switch driver circuit examples provide electrical separation between the I/O input from a signal source 106 and the buffer capacitor CB, and circuitry to monitor the buffer capacitor voltage VDPP and toggle from the low impedance precharging operation to current limiting operation, without external supply connections and without external current limiting components. The disclosed examples facilitate use of a single pin for both digital signaling and power supply, along with internal limitation of the absorbed current $I_M$ from the signal source 106 in a silicon based device.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An isolated load switch driver circuit, comprising:
a signal input to receive a digital input voltage signal;
an output circuit to provide a digital output voltage signal isolated from the digital input voltage signal;
a buffer capacitor having a first terminal connected to a reference voltage and a second terminal;
current limiter circuit, including first and second transistors connected in a back-to-back configuration between the signal input and the second terminal of the buffer capacitor;
a first control circuit, including:
a first output to provide a first signal to a control terminal of the first transistor to turn the first transistor on in response to the digital input voltage signal transitioning from the reference voltage to a second voltage, and
a second output to provide a second signal to a control terminal of the second transistor to turn the second transistor on in response to the digital input voltage signal transitioning from the reference voltage to the second voltage until a voltage of the second terminal of the buffer capacitor reaches a first threshold voltage; and
a second control circuit to provide a third signal to the control terminal of the second transistor to limit an amplitude of a current signal flowing from the signal input to the second terminal of the buffer capacitor in response to the voltage of the second terminal of the buffer capacitor reaching the first threshold voltage.

2. The isolated load switch driver circuit of claim 1, wherein the first control circuit includes a tri-state buffer to selectively provide the second signal at the second output in response to the digital input voltage signal transitioning from the reference voltage to the second voltage, and to discontinue provision of the second signal at the second output in response to the voltage of the second terminal of the buffer capacitor reaching the first threshold voltage.

3. The isolated load switch driver circuit of claim 2, wherein the second control circuit includes a current mirror circuit that is disabled until the voltage of the second terminal of the buffer capacitor reaches the first threshold voltage, and enabled to provide the third signal to the control terminal of the second transistor in response to the voltage of the second terminal of the buffer capacitor reaching the first threshold voltage.

4. The isolated load switch driver circuit of claim 3, wherein the first and second transistors are p-channel transistors connected in the back-to-back configuration between the signal input and the second terminal of the buffer capacitor.

5. The isolated load switch driver circuit of claim 2, wherein the first and second transistors are p-channel transistors connected in the back-to-back configuration between the signal input and the second terminal of the buffer capacitor.

6. The isolated load switch driver circuit of claim 1, wherein the second control circuit includes a current mirror circuit that is disabled until the voltage of the second terminal of the buffer capacitor reaches the first threshold voltage, and enabled to provide the third signal to the control terminal of the second transistor in response to the voltage of the second terminal of the buffer capacitor reaching the first threshold voltage.

7. The isolated load switch driver circuit of claim 1, wherein the current limiter circuit further includes:
a third transistor connected between the signal input and the second terminal of the buffer capacitor, including a control terminal connected to the signal input; and
a resistor connected between the control terminal of the first transistor and a first node that joins the first and second transistors.

\* \* \* \* \*